United States Patent
Takeda et al.

Patent Number: 6,121,540
Date of Patent: Sep. 19, 2000

[54] COMPOSITE MATERIAL SUBSTRATE FOR SOLAR CELLS, AND SOLAR CELL

[75] Inventors: Hiromitsu Takeda, Tokyo; Atsushi Kamata, Kanagawa-ken; Hiroki Inagaki, Kanagawa-ken; Seiichi Suenaga, Kanagawa-ken, all of Japan

[73] Assignee: Kabushiki Kaisha Toshiba, Kawasaki, Japan

[21] Appl. No.: 09/340,038

[22] Filed: Jun. 28, 1999

[30] Foreign Application Priority Data

Jun. 30, 1998 [JP] Japan .................................. 10-184915

[51] Int. Cl.$^7$ .................................. H01L 25/00
[52] U.S. Cl. .................................. 136/244
[58] Field of Search .................................. 136/244

[56] References Cited

FOREIGN PATENT DOCUMENTS

| | | |
|---|---|---|
| 5-235391 | 9/1993 | Japan . |
| 5-315259 | 11/1993 | Japan . |
| 6-283737 | 10/1994 | Japan . |

*Primary Examiner*—Mark Chapman
*Attorney, Agent, or Firm*—Oblon, Spivak, McClelland, Maier & Neustadt, P.C.

[57] ABSTRACT

A composite material substrate comprises a matrix material and a skeleton structure of a fibrous material. The matrix material exclusively participates in the thermal expansion of the substrate and the fibrous material in the mechanical strength thereof. The fibrous material constituting the skeleton structure has no influence on the thermal expansion profile of the matrix material, and the skeleton structure is loosely bonded to the matrix material at their interface. The substrate is used for solar cells. Photoelectric transfer layers of semiconductors are formed on the substrate to fabricate large-sized solar cells.

27 Claims, 3 Drawing Sheets

COMPOSITE MATERIAL SUBSTRATE FOR SOLAR CELLS, AND SOLAR CELL

BACKGROUND OF THE INVENTION

1. Field of the Invention

The present invention relates to a composite material substrate for solar cells comprising semiconductor materials, and to a technique of producing large-sized solar cells each having a large area panel.

2. Discussion of the Background

Devices with thin semiconductor films require substrates for the thin films. Semiconductor films are formed on substrates through chemical vapor deposition (CVD) or thermal spraying. In general, the films as formed in such methods are not crystalline enough to satisfactorily exhibit their semiconductive properties, and therefore must be subjected to an additional melting and recrystallizing step to produce monocrystalline or polycrystalline morphology. The resulting monocrystalline or polycrystalline films of Si or the like could be photoelectric transfer layers for solar cells. Therefore, the substrates for semiconductor films must be resistant to heating at the melting point of semiconductor materials, which is extremely high and is often above 1000° C. In addition, the thermal expansion coefficient of the substrates must conform with the thermal expansion coefficient of semiconductor materials. This is because the semiconductor layers to be formed on the substrates must not crack at high temperatures at which they are formed and also at room temperature, without being influenced by the thermal expansion of the underlying substrates. Heretofore, heat-resistant materials of aluminium oxide, magnesium oxide, silicon oxide and the like having a low thermal expansion coefficient have been used for the substrates. However, the substrates of those materials are still problematic when their size is large. For example, when they have a size of 3 inches or larger, the semiconductor films formed thereon are often cracked.

In particular, for large-sized solar cells in which the panel has a large area of at least 10 inches in diameter, the thermal conformity as above between the substrates and the semiconductor films to be formed thereon is an important factor and is indispensable. Conventional substrates do not conform well to semiconductor materials such as silicon, and often induce cracks in Si layers or even crystal defects therein, which are fatal to devices. For popularizing solar cells as power-generating systems installed on roofs for household use, their structure must have sufficiently high strength to resist typhoons, hurricanes, strong winds, and other rough weather. However, substrates made of available materials as above which are large in size but not thick do not have high strength, and are often broken. Conventional solar cells have a unit panel size of at most 100 cm$^2$, and, at present, are not large-sized solar cell panels that satisfy the requirements noted above. It is desirable to have a technique to enlarge the size of solar cells by enlarging the area of a unit cell or panel in solar power devices, and not merely integrate a plurality of solar cells into one solar power device.

SUMMARY OF THE INVENTION

An object of the present invention is to solve the problems noted above. It is an object of the present invention to provide substrates for large-sized solar cells that satisfy two requirements. First, the substrates conform well with thin semiconductor films in view of their thermal expansion coefficient. Specifically, in temperature change from high temperatures to room temperature in the process of producing solar cells, they do not thermally stress thin semiconductor films formed thereon. Upon receiving thermal stress, thin semiconductor films formed on the substrates crack. Second, the substrate structures have high strength, being resistant even to the worst weather conditions with strong winds, and are not broken by any external environmental force.

An object of the present invention is to achieve substrates having a necessary and sufficient mechanical strength and having a thermal expansion coefficient conformable to the thermal expansion of semiconductors (e.g., Si).

In the present invention, a skeleton structure consisting essentially of high-strength fibers is combined with a matrix material of which the bonding force to the high-strength fibers is low and of which the thermal expansion coefficient is about the same as that of Si, in such a manner that the high-strength fibers are embedded in the matrix material. Then the resulting composite material has a predetermined thermal expansion coefficient and has a satisfactorily high mechanical strength. Large-sized solar cells may be formed using the composite material in substrates.

The present invention provides loose bonding between the skeleton structure and the matrix material in the substrate so that the two components, skeleton and matrix, are distorted owing to temperature change around them and have no mechanical influence on each other. The present invention defines a rule of acceptable bonding of the two, skeleton and matrix, in some degree, depending on the morphology of the skeleton structure. The rule is represented by the following experiential formulae (1) and (2):

$$\sigma b / \sigma t \geq C \tag{1}$$

$$C = a \cdot \sqrt{S} \tag{2}$$

wherein σb is the bending strength of the substrate, σt indicates the tensile strength of the substrate, S is the area of the substrate, indicates a is a constant. In one aspect of the present invention, a may be 0.0625 and S is 256 cm$^2$ or more.

Solar cells incorporating the substrate of that type have high strength and their size can be enlarged. Combining the substrate with semiconductor films formed thereon and subjected to the step of melting and recrystallization thereon produces solar cells having high photoelectric transfer efficiency.

In one aspect of the present invention, the combination of the skeleton structure and the matrix material have the thermal expansion coefficient of the skeleton structure equal to or larger than that of the matrix material minus 2×10$^{-6}$/° C.

In one aspect of the present invention, a semiconductor formed on the substrate is silicon, the skeleton structure of the substrate may have a thermal expansion coefficient of at least 3×10$^{-6}$/° C. and the matrix material thereof has a thermal expansion coefficient in the range of 1×10$^{-6}$/° C. to 6×10$^{-6}$/° C.

In another aspect of the present invention, the semiconductor formed on the substrate is not Si but is SiC, SiGe or the like compound, the skeleton structure of the substrate may be of the same material as that for Si, and the thermal expansion coefficient of the matrix material of the substrate is within the range of the thermal expansion coefficient of the semiconductor compound +/−2×10$^{-6}$/° C.

In another aspect of the present invention, a method of producing a composite material substrate comprises a composite-forming step of infiltrating a carbon-containing liquid substance into a fibrous material as a skeleton structure, followed by vaporizing the volatile component away from the carbon-containing liquid substance to form a matrix of carbons poorly bonding to the fibrous material. The vaporization may be effected through carbonization under heat at a temperature lower than 1800° C. in an inert atmosphere.

In another aspect of the present invention, the skeleton structure is of a material selected from carbon fibers, silicon carbide fibers, glass fibers, alumina fibers, aluminium nitride fibers and zirconia fibers. In another aspect of the present invention, the matrix material is selected from carbonized phenolic resin, carbonized polycarbodiimide resin, carbonized petroleum pitch, glass, aluminium nitride and magnesia.

In another aspect of the present invention, the skeleton structure is coated with an interfacial bonding retardant to form loose bonding between the skeleton structure and the matrix material in the substrate. In another aspect of the present invention, the interfacial bonding retardant is selected from boric acid, boron nitride, aluminium nitride, silicon nitride, yttrium oxide, aluminium oxide, and zinc oxide.

DETAILED DESCRIPTION OF THE PREFERRED EMBODIMENTS

Figure 1:
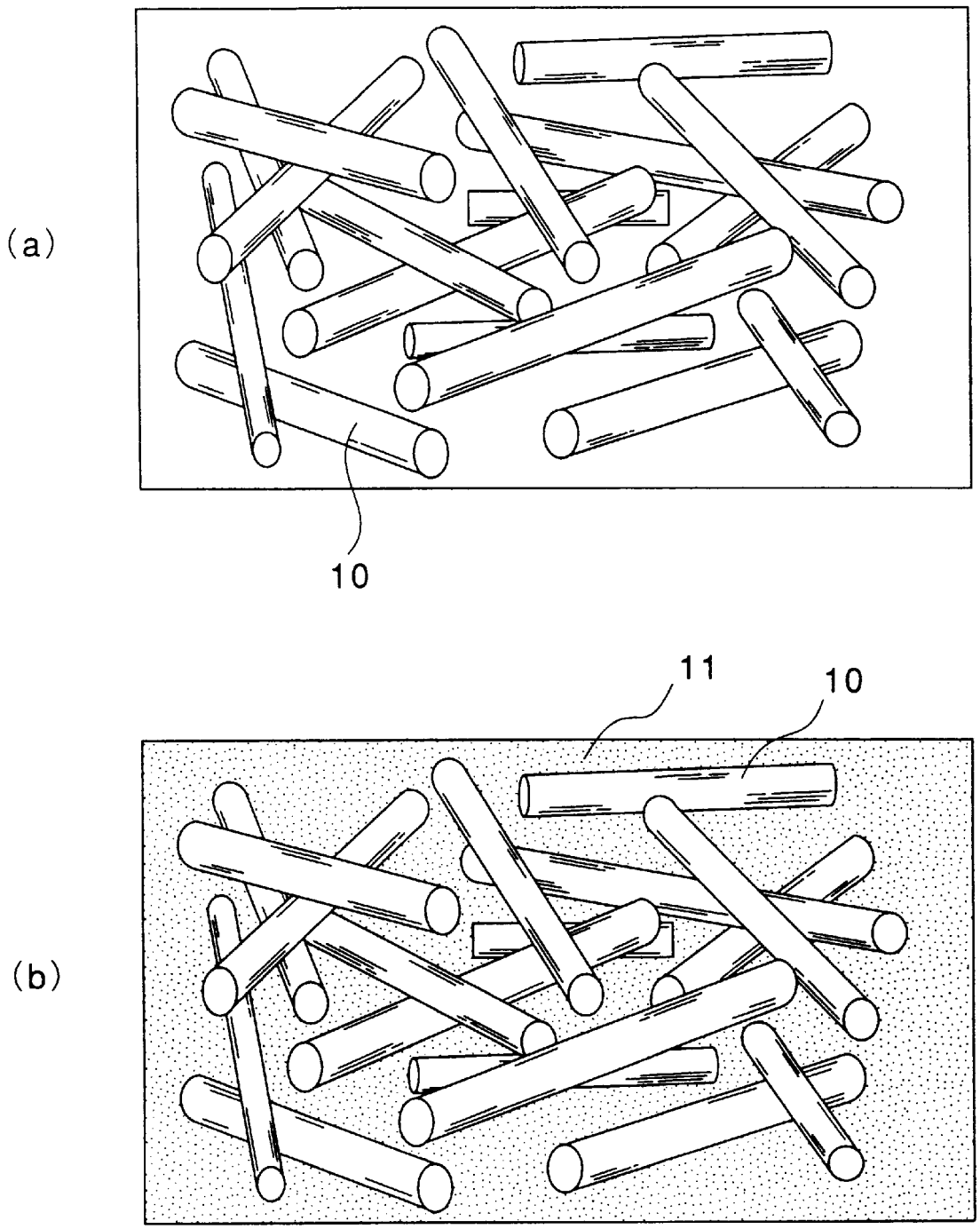
FIG. 1A and FIG. 1B are cross-sectional views of a substrate having high strength carbon fibers and a phenolic resin in accordance with a first embodiment of the present invention.

A plurality of single materials is compounded in a rule of composition to obtain physical properties which single materials could not have. However, the physical properties for which the rule of composition could be expressed as numerical formulae are limited to only mechanical properties of elastic modulus, strength, etc. For the other physical properties, however, various theoretical formulae have been proposed which could not directly conform to actual materials. In particular, the thermal expansion coefficient of composite materials is influenced by the microstructure thereof and could hardly be expressed as numerical formulae. The composite material substrate of the present invention has solved the unexplored problem in the art, and is characterized in that its two different physical properties, strength and thermal expansion, are both controlled to desired ones.

Specifically, the structure of the substrate of the present invention exhibits the two different physical properties in such a manner that the two do not interfere with each other. In the substrate structure, the matrix material exclusively participates in the thermal expansion characteristic of the structure while the skeleton moiety comprises a fibrous substance exclusively participates in the strength thereof. In this, the fibrous substance has a specific interfacial characteristic which does not influence the thermal expansion profile of the matrix. The interfacial characteristic is attained when the fibrous substance is loosely bonded to the matrix. In this point, the technical feature of the present invention is quite contrary to the conventional technical views of firmly and tightly bonding the skeleton structure to the matrix in composite material substrates. While thermally expanded, all constituent components are microscopically deformed in the composite material of the present invention. In that condition, the skeleton structure bonds little to the matrix material in the substrate, and therefore does not restrain the deformation of the matrix material.

In the present invention, the substrate is applied to large-sized solar cells. When the temperature changes in the substrate from high temperatures to low temperatures, the substrate of the present invention has the thermal expansion coefficient of the skeleton structure larger than that of the matrix material, and the fibers constituting the skeleton structure shrink by themselves in such temperature change and have no influence on the matrix material. On the other hand, when the substrate receives any external force, the force is uniformly distributed among the fibers as the fibers are mechanically restrained by the matrix material existing around them. In particular, the composite material substrate of the present invention is satisfactorily effective against bending stress. In applying the substrate to solar cell panels, the bending strength of the substrate is one important factor.

The loose bonding between the skeleton structure and the matrix material in the substrate of the present invention is that the two components, skeleton and matrix, are distorted owing to temperature change around them have no mechanical influence on each other. The present invention provides acceptable bonding of the skeleton and matrix, in some degree, depending on the morphology of the skeleton structure. The acceptable bonding is represented by the following formulae (1) and (2):

$$\sigma b/\sigma t \geq C \quad (1)$$

$$C = a \cdot \sqrt{S} \quad (2)$$

wherein $\sigma b$ is the bending strength of the substrate, $\sigma t$ is the tensile strength of the substrate, S is the area of the substrate, and a is a constant. In one embodiment of the present invention, a is 0.0625 and S is 256 cm² or more.

The present invention is described in more detail with reference to the following examples, which are illustrative but not limitative and which facilitate a deeper understanding of the present invention.

EXAMPLE 1

A phenolic resin was infiltrated into a non-woven fabric for a skeleton structure of high-strength carbon fibers having a mean fiber diameter of 12 $\mu$m (for example, a commercial product of Melbron CF Felt™). The fabric had a size of 600 mm×600 mm and a thickness of 1 mm. After being cured, the fabric was carbonized in a furnace at 1400° C. to which no pressure was applied to increase the bonding between the carbonized phenolic resin and the carbon fibers. Besides the high-strength carbon fibers, the skeleton structure may be formed of silicon carbide fibers, glass fibers, alumina fibers, aluminium nitride fibers and zirconia fibers. Besides the phenolic resin, the carbon-containing liquid substance may be, for example, polycarbodiimide resin or heavy petroleum such as petroleum pitch. The carbon-containing liquid substance may be mixed with an organic solvent to control its viscosity.

FIG. 1A is an enlarged view of a plurality of high-strength carbon fibers 10. FIG. 1B shows the condition of the carbon fibers 10 with a phenolic resin 11 as infiltrated thereinto, in which, however, the phenolic resin 11 is not yet carbonized.

Figure 2:
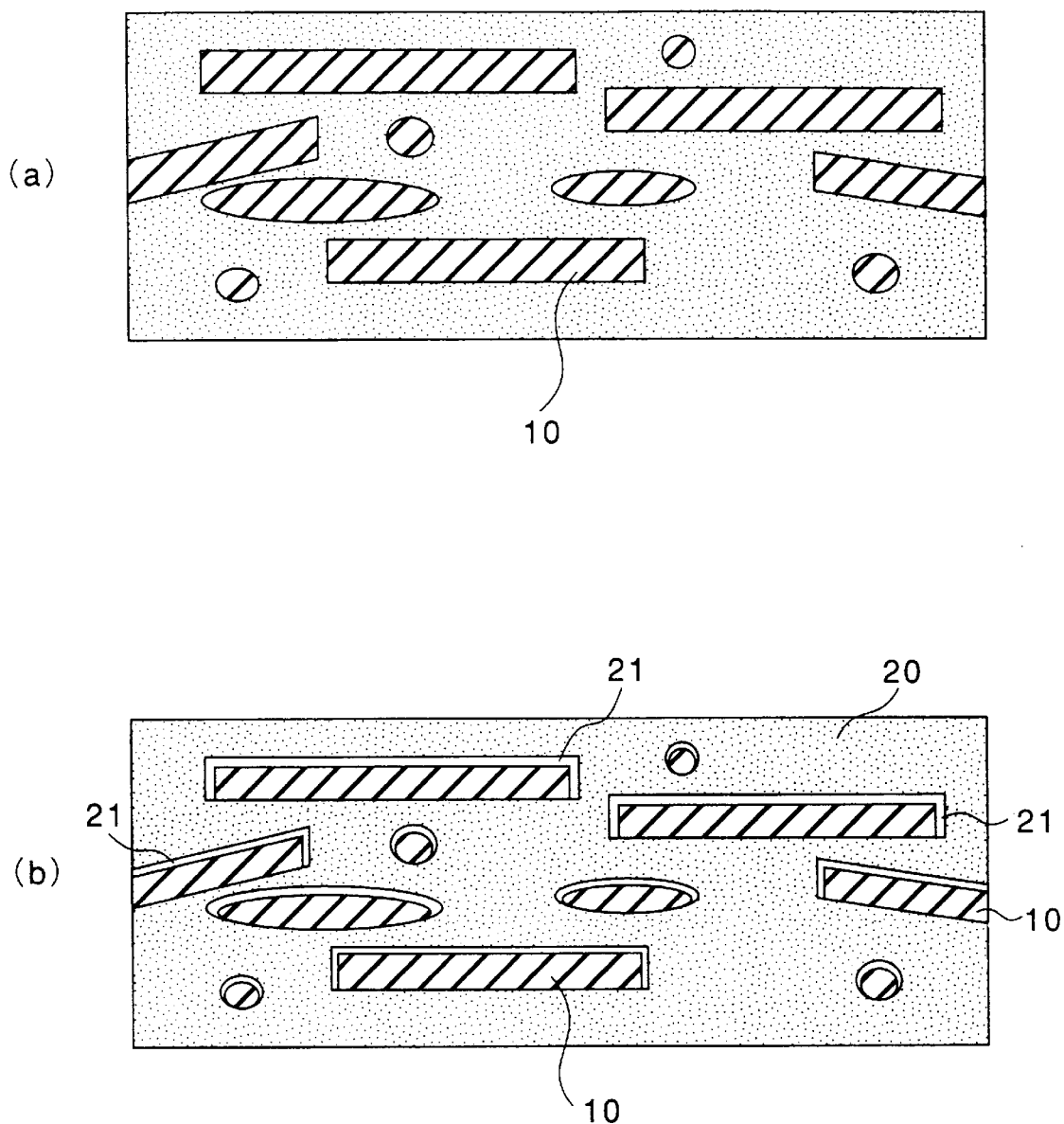
FIG. 2A and FIG. 2B are cross-sectional views of a substrate of FIGS. 1A and 1B.

FIG. 2A shows the inside condition at 1000° C. of the substrate as produced herein.

FIG. 2B shows the inside condition at 20° C. of the substrate. As shown in FIG. 2B, at 20° C. weak and loose bonding regions 21 are formed between the high-strength carbon fibers 10 and the matrix material 20.

In the carbon fiber-reinforced, carbon matrix composite material substrate produced herein, the high-strength carbon fibers 10 account for 30% by volume. The physical properties of the composite material substrate were measured. At room temperature, the substrate had a thermal expansion coefficient of $2.5 \times 10^{-6}/°$ C. and a bending strength of 150 MPa.

A Si film was formed on the composite material substrate through CVD at 1000° C. at a deposition rate of 5 $\mu$m/min to have a thickness of 15 $\mu$m, and then cooled to room temperature. In this process, the formed Si film was not cracked despite having a large area of 600 mm×600 mm.

Figure 3:
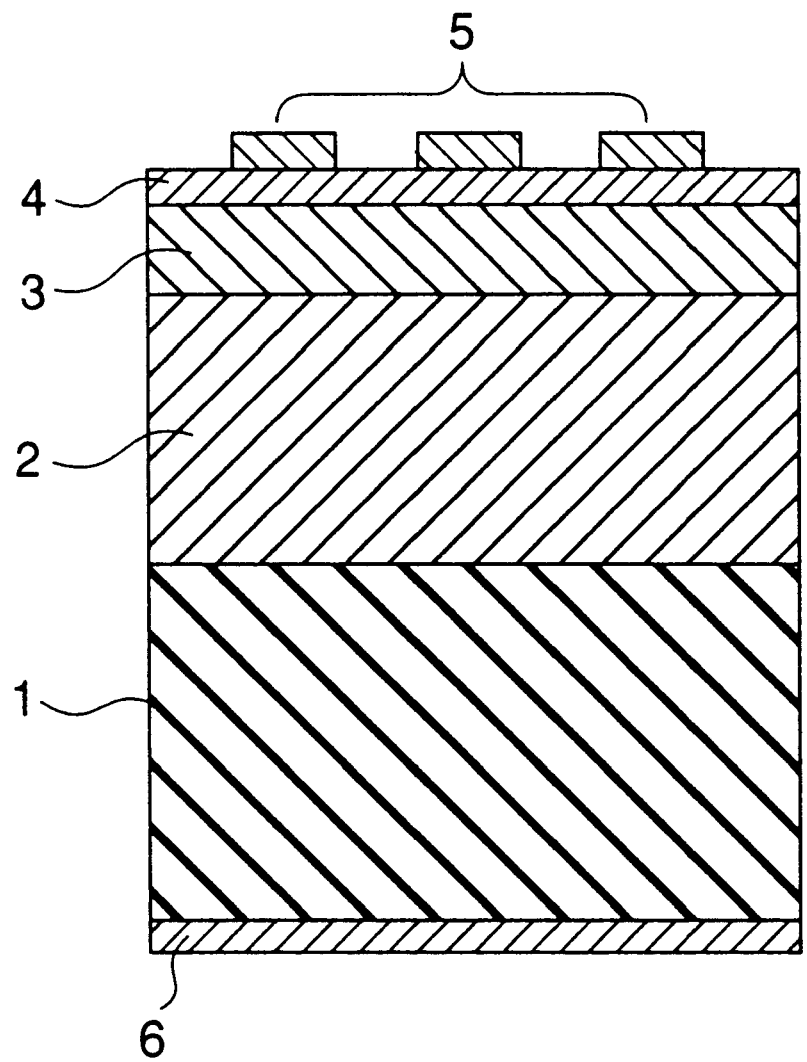
FIG. 3 is a cross-sectional view graphically showing a solar cell in accordance with the first embodiment of the present invention.

FIG. 3 is a cross-sectional view illustrating a solar cell using the substrate produced in Example 1.

Next, a solar cell incorporating this substrate was fabricated, as in FIG. 3, in which the reference number 1 is the composite material substrate. As illustrated, a P-type silicon layer 2, an N-type silicon layer 3 and a ZnO layer 4 are formed in that order on the substrate 1. A collector electrode 5 is directly formed on the ZnO layer 4, and a collector electrode 6 is formed on the substrate 1. The P-type silicon layer 2 and the N-type silicon layer 3 act as the carrier-generating layer that receives light and generates carriers. The collector electrode 5 and the collector electrode 6 are a pair of electrodes, acting to collect the electromotive force as generated by the carriers formed around the interface between the P-type silicon layer 2 and the N-type silicon layer 3. The silicon layers formed herein are polycrystalline silicon layers. To form the silicon layers of that type, thermal spraying using fine silicon grains may be employed. CVD may also be employed.

The solar cell structure was formed on a large-sized substrate of 600 mm×600 mm. A solar cell of this large size could not have been formed in the prior art techniques described in the Background of the Invention. The solar cell thus fabricated herein had a powering efficiency of 12%. This was on a practicable level.

Table 1 below shows the power-generating efficiency of solar cells as fabricated in the manner described herein. As shown in Table 1, the power-generating efficiency of the cells increases with the increase in the size of the substrate having loosely bonding regions 21 therein and with the increase in the crystallinity of the silicon films. In Table 1, cells having a power-generating efficiency of at least 12% are designated by A; those having a power-generating efficiency of from 8% to less than 12% are designated by B; and those having a power-generating efficiency of less than 8% are designated by D.

TABLE 1

| | Size of Substrate (cm2) | | | | | | | |
|---|---|---|---|---|---|---|---|---|
| C | 300 | 500 | 1000 | 2000 | 4000 | 6000 | 8000 | 10000 |
| 1 | B | D | D | D | D | D | D | D |
| 1.5 | A | B | D | D | D | D | D | D |
| 2 | A | A | B | D | D | D | D | D |
| 2.5 | A | A | A | D | D | D | D | D |
| 3 | A | A | A | B | D | D | D | D |
| 3.5 | A | A | A | A | D | D | D | D |
| 4 | A | A | A | A | B | D | D | D |
| 4.5 | A | A | A | A | B | D | D | D |
| 5 | A | A | A | A | A | B | D | D |
| 5.5 | A | A | A | A | A | A | D | D |
| 6 | A | A | A | A | A | A | B | D |
| 6.5 | A | A | A | A | A | A | A | B |
| 7 | A | A | A | A | A | A | A | A |

TABLE 1-continued

The data may be represented by the following formulae (1) and (2):

$$\sigma b/\sigma t \geq C \qquad (1)$$

$$C = a \cdot \sqrt{S} \qquad (2)$$

wherein $\sigma b$ is the bending strength of the substrate, $\sigma t$ is the tensile strength of the substrate, S is the area of the substrate, and a is a constant. In one embodiment of the present invention, a is 0.0625 and S is 256 cm$^2$ or more.

EXAMPLE 2

Petroleum pitch was infiltrated into a non-woven fabric for a skeleton structure of high-strength silicon carbide (SiC) fibers having a mean fiber diameter of 6 $\mu$m. The fabric had a size of 600 mm×600 mm and a thickness of 1 mm. The fabric was calcined at 450° C. to remove the volatile content, and then carbonized in a furnace at 1300° C. to which no pressure was applied to increase the bonding between the carbonized petroleum pitch and the SiC fibers. In the SiC fiber-reinforced, carbon matrix composite material substrate produced herein, the high-strength SiC fibers account for 35% by volume. The physical properties of the composite material substrate were measured. At room temperature, the substrate had a thermal expansion coefficient of $2.8 \times 10^{-6}/°$ C. and a bending strength of 175 MPa.

A Si film was formed on the composite material substrate through plasma spraying to have a thickness of 30 $\mu$m, which was then locally heated at 1500° C. for melt recrystallization. After the heat treatment, the Si film was not cracked and was kept good. Solar cells incorporating this substrate were fabricated in the same manner as in Example 1, and these gave similar results as in Example 1.

The composite material substrate of the present invention has high strength and can be directly used in fabricating large-sized solar cells, without being reinforced with any additional costly reinforcing material. In addition, the substrate is inexpensive, since inexpensive non-woven fabric and inexpensive phenolic resin or pitch is incorporated in its formation. Substrates formed from conventional materials could not be produced so inexpensively.

EXAMPLE 3

High-strength carbon fibers having a mean fiber diameter of 12 $\mu$m and a mean length of 5 mm, and having a thermal expansion coefficient in the lengthwise direction of $4.5 \times 10^{-6}/°$ C. were mixed with a polycarbodiimide resin in a ratio by volume, fibers/resin, of 4/6, and the resulting mixture was sheeted into a sheet having a thickness of 1.5 mm. The sheet was heated up to 1800° C. in an argon atmosphere over a period of 100 hours so as to carbonize the resin moiety therein. Thus a carbon fiber-reinforced, carbon matrix composite material substrate having a thickness of about 1 mm was formed. The fiber content of the substrate was about 60% by volume. The substrate had a thermal expansion coefficient at around room temperature of $2.5 \times 10^{-6}/°$ C. and a bending strength of 240 MPa. In the substrate, the carbons constituting the matrix moiety were amorphous.

Solar cells incorporating this substrate were fabricated in the same manner as in Example 2, and these gave similar results as in Example 1.

EXAMPLE 4

A phenolic resin was infiltrated into a non-woven fabric of high-strength carbon fibers having a mean fiber diameter of 12 $\mu$m (for example, a commercial product of Melbron CF Felt™). The fabric had a size of 600 mm×600 mm and a thickness of 1 mm. After being cured, one surface of the fabric was coated with a polycarbodiimide resin that contained a graphite powder having a mean grain size of 30 $\mu$m in an amount of 20% by volume, thereby forming a layer thereon having a thickness of 20 $\mu$m. This was heated up to 1800° C. in an argon atmosphere over a period of 100 hours so as to carbonize the resin moiety therein. Thus a carbon fiber-reinforced, carbon matrix composite material substrate having a thickness of about 1 mm was formed. The physical properties of the substrate were measured. At room temperature, the substrate had a thermal expansion coefficient of $2.5 \times 10^{-6}/°$ C. and a bending strength of 150 MPa. In the substrate, the carbons existing in the area coated with the mixture of polycarbodiimide resin and graphite powder were amorphous.

In the above examples, the surface of the fibrous material could be coated with a thin film of an interfacial bonding retardant such as boric acid or the like, greatly enhancing the effect of the present invention. Besides carbon fibers and silicon carbide fibers, the skeleton structure may be formed of glass fibers, alumina fibers, aluminium nitride fibers, zirconia fibers and the like. Besides the carbonized phenolic resin and the carbonized petroleum pitch used herein as the inorganic material for the matrix moiety, carbonized products of fluid resins, glass, aluminium nitride and magnesia may be used in the same manner as herein. The silicon layers constituting solar cells are not limited to polycrystalline layers as described herein. Microcrystalline silicon and amorphous silicon are also applicable to the solar cells as in the above examples.

While the present invention has been described in detail and with reference to specific embodiments thereof, it will be apparent to one skilled in the art that various changes and modifications can be made therein without departing from the spirit and scope thereof.

What is claimed is:

1. A composite material substrate for solar cells, which comprises a skeleton structure of a fibrous material and a matrix material as infiltrated into the skeleton structure of said fibrous material to form loose bonding to said fibrous material, wherein said skeleton structure is correlated with said matrix material according to the following formulae (1) and (2):

$$\sigma b/\sigma t \geq C \quad (1)$$

$$C = a \cdot \sqrt{S} \quad (2)$$

wherein $\sigma b$ is the bending strength of the substrate, $\sigma t$ is the tensile strength of the substrate, S is the area of the substrate, and indicates a is a constant.

2. The composite material substrate for solar cells as claimed in claim 1, wherein the thermal expansion coefficient of said skeleton structure is equal to or larger than that of the matrix material minus $2 \times 10^{-6}/°$ C.

3. The composite material substrate for solar cells as claimed in claim 2, wherein the thermal expansion coefficient of said matrix material infiltrated into said skeleton structure is in the range of $1 \times 10^{-6}/°$ C. and $6 \times 10^{-6}/°$ C.

4. The composite material substrate for solar cells as claimed in claim 1, wherein said skeleton structure is of a fibrous material selected from carbon fibers, silicon carbide fibers, glass fibers, alumina fibers, aluminium nitride fibers and zirconia fibers.

5. The composite material substrate for solar cells as claimed in claim 4, wherein said matrix material is selected from carbonized phenolic resin, carbonized polycarbodiimide resin, carbonized petroleum pitch, glass, aluminium nitride and magnesia.

6. The composite material substrate for solar cells as claimed in claim 5, wherein the surface of said fibrous material constituting the skeleton structure is coated with an interfacial bonding retardant.

7. The composite material substrate for solar cells as claimed in claim 6, wherein said interfacial bonding retardant is a compound selected from boric acid, boron nitride, aluminium nitride, silicon nitride, yttrium oxide, aluminium oxide and zinc oxide.

8. A method for producing a composite material substrate for solar cells that comprises a skeleton structure of a fibrous material and a matrix material as infiltrated into the skeleton structure of said fibrous material; the method comprising:

a composite-forming step of infiltrating a carbon-containing liquid substance into the skeleton structure of a fibrous material; and carbonizing the carbon-containing liquid substance to generate a matrix of carbons.

9. The method for producing a composite material substrate for solar cells as claimed in claim 8, wherein said skeleton structure is correlated with the matrix material according to formulae (1) and (2):

$$\sigma b/\sigma t \geq C \quad (1)$$

$$C = a \cdot \sqrt{S} \quad (2)$$

in which $\sigma b$ is the bending strength of the substrate, $\sigma t$ is the tensile strength of the substrate, S is the area of the substrate, and a is a constant.

10. The method for producing a composite material substrate for solar cells as claimed in claim 9, wherein the thermal expansion coefficient of said skeleton structure is equal to or larger than that of the matrix material minus $2 \times 10^{-6}/°$ C.

11. The method for producing a composite material substrate for solar cells as claimed in claim 10, wherein the thermal expansion coefficient of said matrix material infiltrated into said skeleton structure is in the range of $1 \times 10^{-6}/°$ C. and $6 \times 10^{-6}/°$ C.

12. The method for producing a composite material substrate for solar cells as claimed in claim 9, wherein said carbon-containing liquid substance consists essentially of an organic material selected from phenolic resin, polycarbodiimide resin and heavy petroleum.

13. The method for producing a composite material substrate for solar cells as claimed in claim 12, wherein said composite-forming step comprises carbonization under heat at a temperature of not higher than 1800° C. in an inert atmosphere.

14. The method for producing a composite material substrate for solar cells as claimed in claim 8, wherein said skeleton structure is of a fibrous material selected from carbon fibers, silicon carbide fibers, glass fibers, alumina fibers, aluminium nitride fibers and zirconia fibers.

15. The method for producing a composite material substrate for solar cells as claimed in claim 14, wherein the surface of said fibrous material constituting the skeleton structure is coated with an interfacial bonding retardant.

16. The method for producing a composite material substrate for solar cells as claimed in claim 15, wherein said interfacial bonding retardant is a compound selected from boric acid, boron nitride, aluminium nitride, silicon nitride, yttrium oxide, aluminium oxide and zinc oxide.

17. A solar cell comprising:
a composite material substrate that comprises a skeleton structure of a fibrous material and a matrix material as infiltrated into the skeleton structure of said fibrous material;
a carrier-generating semiconductor layer disposed on said composite material substrate to receive light and generate carriers in response to said received light; and
a pair of electrodes electrically connected to said carrier-generating layer, to extract an electromotive force generated by said generated carriers;
wherein said skeleton structure is correlated with said matrix material according to the following formulae (1) and (2):

$$\sigma b / \sigma t \geq C \quad (1)$$
$$C = a \cdot \sqrt{S} \quad (2)$$

wherein σb is the bending strength of the substrate, σt is the tensile strength of the substrate, S is the area of the substrate, and a is a constant.

18. The solar cell as claimed in claim 17, wherein the thermal expansion coefficient of said skeleton structure is equal to or larger than that of the matrix material minus $2 \times 10^{-6}/°C$.

19. The solar cell as claimed in claim 18, wherein said carrier-generating layer is composed of a P-type silicon layer and an N-type silicon layer laminated together.

20. The solar cell as claimed in claim 19, wherein said semiconductor layer is a silicon layer of polycrystalline silicon, microcrystalline silicon or amorphous silicon.

21. The solar cell as claimed in claim 20, wherein said skeleton structure has a thermal expansion coefficient of at least $3 \times 10^{-6}/°C$.

22. The solar cell as claimed in claim 21, wherein said matrix material has a thermal expansion coefficient in the range of $1 \times 10^{-6}/°C$ and $6 \times 10^{-6}/°C$.

23. The solar cell as claimed in claim 17, wherein said skeleton structure is of a fibrous material selected from carbon fibers, silicon carbide fibers, glass fibers, alumina fibers, aluminium nitride fibers and zirconia fibers.

24. The solar cell as claimed in claim 23, wherein said matrix material is selected from carbonized phenolic resin, carbonized polycarbodiimide resin, carbonized petroleum pitch, glass, aluminium nitride and magnesia.

25. The solar cell as claimed in claim 23, wherein the surface of said fibrous material constituting the skeleton structure is coated with an interfacial bonding retardant.

26. The solar cell as claimed in claim 25, wherein said interfacial bonding retardant is a compound selected from boric acid, boron nitride, aluminium nitride, silicon nitride, yttrium oxide, aluminium oxide and zinc oxide.

27. The solar cell as claimed in claim 17, wherein S is equal to or greater than 256 square centimeters and a equal to 0.0625.

* * * * *